United States Patent [19]
Ebe et al.

[11] Patent Number: 5,394,826
[45] Date of Patent: Mar. 7, 1995

[54] METHOD OF (111) GROUP II-VI EPITAXIAL LAYER GROWN ON (111) SILICON SUBSTRATE

[75] Inventors: Hiroji Ebe; Akira Sawada, both of Kawasaki, Japan
[73] Assignee: Fujitsu Limited, Kawasaku, Japan
[21] Appl. No.: 139,743
[22] Filed: Oct. 22, 1993

Related U.S. Application Data

[62] Division of Ser. No. 987,683, Dec. 9, 1992, Pat. No. 5,302,232.

[30] Foreign Application Priority Data

Jan. 31, 1992 [JP] Japan ................... 4-16663

[51] Int. Cl.$^6$ ........................................... H01L 21/20
[52] U.S. Cl. ................... 117/101; 117/104; 117/956
[58] Field of Search ............ 156/614; 437/93, 132; 148/DIG. 115

[56] References Cited

U.S. PATENT DOCUMENTS 4,828,938  5/1989  Lichtmann et al. ................ 428/689

FOREIGN PATENT DOCUMENTS

| 0332198 | 9/1989 | European Pat. Off. | |
| 3617927 | 5/1986 | Germany | 437/132 |
| 0276313 | 12/1986 | Japan | 437/132 |
| 194322 | 8/1988 | Japan | 437/132 |
| 153409 | 3/1989 | Japan | 437/132 |
| 1312821 | 12/1989 | Japan | 437/132 |
| 2078695 | 1/1982 | United Kingdom | |
| 2130189 | 5/1984 | United Kingdom | |
| 2156857 | 10/1985 | United Kingdom | |

OTHER PUBLICATIONS

Nouhi et al., "Molecular beam epitaxy and metalorganic chemical vapor deposition growth of epitaxial CdTe on (100) GaAs/Si and (111) GaAs/Si substrates," *Applied Physics Letters,* vol. 52, No. 24, Jun. 13, 1988, New York, US, pp. 2028-2030.

Halsall et al., "Growth and assessment of CdS and CdSe layers produced on GaAs by metalorganic chemical vapour deposition," *Journal of Crystal Growth,* vol. 91, No. 1-2, Aug. 1988, Amsterdam, NL, pp. 135-140.

Tompa et al., "Multiwafer growth of CdTe on GaAs by metalorganic chemical vapor deposition in a vertical, high-speed, rotating disk reactor," *Applied Physics Letters,* vol. 55, No. 1, Jul. 3, 1989, New York, US, pp. 62-64.

Liaw et al., "X-ray double-crystal diffraction studies of CdTe/GaAs heteroepitaxial layers," *Journal of Crystal Growth,* vol. 100, No. 3, Mar. 1990, Amsterdam, NL, pp. 508-514.

Smith et al., "The growth of CdHgTe on GaAs and fabrication of high-quality photodiodes," *Journal of Vacuum Science and Technology:* Part A, vol. 8, No. 2, Mar. 1990, New York, US, pp. 1078-1085.

Ebe et al., "CdTe rotation growth on silicon substrates by metallo-organic chemical vapour deposition," *Materials Science and Engineering B,* vol. B16, No. 1/3, Jan. 30, 1993, Lusanne, CH, pp. 57-59.

Mendelson in "Stacking fault nucleation in epitaxial silicon on variously oriented silicon substrates" in Journal applied Physics, vol. 35(5), May 1964, pp. 1570-1581.

*Primary Examiner*—R. Bruce Breneman
*Assistant Examiner*—Ramamohan Rao Paladugu
*Attorney, Agent, or Firm*—Staas & Halsey

[57] ABSTRACT

A group II-VI epitaxial layer grown on a (111) silicon substrate has a lattice mismatch which is minimized, as between the group II-VI epitaxial layer and the silicon substrate. The grown group II-VI epitaxial layer also has a (111) plane at the interface with the substrate, and a 30° in-plane rotation slip is formed at the interface between the (111) silicon substrate and the group II-VI epitaxial layer. The above structure is produced by a metal organic chemical vapor deposition method (MOCVD), in which a mol ratio of a group VI gas source supply to a group II gas source supply is kept greater than 15 during the growth. The (111) silicon substrate is preferably mis-oriented toward the $<1\bar{1}0>$ direction of the silicon substrate. When a HgCdTe layer is grown on the epitaxial layer, the product thus formed has utility as a monolithic infrared detector in which a plurality of detector elements are formed in the HgCdTe layer and a signal processing circuit is formed in the silicon substrate.

7 Claims, 4 Drawing Sheets

METHOD OF (111) GROUP II-VI EPITAXIAL LAYER GROWN ON (111) SILICON SUBSTRATE

This application is a division of application Ser. No. 07/987,683, filed Dec. 9, 1992, now U.S. Pat. No. 5,302,232.

BACKGROUND OF THE INVENTION

1. Field of the Invention

The present invention relates to a group II-VI epitaxial layer grown on a silicon substrate. More particularly, the present invention relates to a (111) CdTe epitaxial layer grown on a (111) silicon substrate. HgCdTe is known as a sensitive material for infrared detection, and HgCdTe hetero-epitaxial growth on a silicon substrate is a key technology for development of monolithtic infrared detectors. For this purpose, a CdTe buffer layer is first grown on a silicon substrate, and thereafter the HgCdTe layer is grown on the CdTe epitaxial layer.

2. Description of the Related Art

A conventional infrared imager of a hybrid type has a structure such that a plurality of infrared detector elements of HgCdTe are formed on a CdTe substrate and a signal processing arrangement, for example, a CCD is formed on a silicon substrate, and two substrates are integrated together using a plurality of bumps forming the infrared imager.

In response to requirements for an increased number of detector elements in order to improve resolution in image detection, an infrared imager of a monolithic type has been proposed. The monolithic infrared imager utilizes a CdTe buffer layer grown on a silicon substrate, and a HgCdTe layer is grown on the CdTe buffer layer. A signal processing arrangement is formed in the silicon substrate and a plurality of detector elements are formed in the HgCdTe layer. The monolithic infrared imager can cope with the increased number of detector elements, and enables simpler manufacturing processes and increases mechanical reliability.

The basic problem in production of the monolithtic infrared imager is to achieve hetero-epitaxial growth of CdTe on a silicon substrate. It is well known that the crystal structure of silicon is of a diamond type and the crystal structure of CdTe is of a zinc-blende type. These two types have sufficient resemblance in lattice structures such that, if both two kinds of atoms of the zinc-blende type are replaced with silicon atoms, the crystal has the same structure as the diamond type of silicon.

In growing a CdTe epitaxial layer on a silicon substrate, the following methods are known, in which the grown CdTe layer has the same crystal orientation as that of silicon substrate. When a silicon substrate having a (100) plane is used, a CdTe epitaxial layer with a (100) plane is grown thereon. When a (111) silicon substrate is used, a (111) CdTe epitaxial layer is grown thereon. In both cases, the grown CdTe layer has the same in-plane direction as the crystal direction of the underlying silicon substrate. One aspect of these technologies is disclosed in "Growth of CdTe films on silicon by molecular beam epitaxy" by H. H. Stadelmaier, J.Apple.Phys. 54(7), July 1983, pp. 4238-4240.

The above methods include a basic problem that a lattice mismatch between silicon and CdTe can not be avoided. In the above case, the lattice mismatch runs to about 19%. It is known that GaAs has the same zinc-blende structure as CdTe and can be used as a substrate or a buffer layer on a silicon substrate. However, the lattice mismatch between GaAs and CdTe is reduced only to 14.6%.

The large lattice mismatch as described above causes crystalline defects such as misfit and dislocation. Other methods of growing a CdTe epitaxial layer with a different crystal orientation from that of a substrate have been tried; however, there still remains a lattice mismatch problem.

SUMMARY OF THE INVENTION

It is a general object of the present invention to provide a group II-VI epitaxial layer on a silicon substrate.

It is another object of the invention to provide a CdTe epitaxial layer on a silicon substrate, wherein a lattice mismatch between CdTe and silicon is minimized.

It is further object of the invention to provide a method of growing a CdTe epitaxial layer which is lattice-matched with the underlying silicon substrate.

The above objects can be achieved by the invention, wherein a (111) silicon substrate is used and a (111) CdTe epitaxial layer is grown thereon, the grown CdTe layer having a 30° in-plane rotation slip with respect to the underlying silicon crystal orientation.

The growth is performed by a metal organic chemical vapor deposition method (MOCVD), in which dimethylcadmium (DMCd) and diethyltelluride (DETe) are used as the cadmium and tellurium sources. The (111) silicon substrate is annealed in a hydrogen atmosphere at 1000° C., and thereafter the substrate temperature is reduced to 400° C. and DMCd and DETe source gases are introduced, wherein a mol ratio of the source gases during the growth, namely, DETe/DMCd, is selected to be greater than 15.

According to the present invention, the surface of (111) silicon substrate is preferably mis-oriented by 1° to 10° toward the $<1\bar{1}0>$ direction.

Other objects and advantages of the present invention will be apparent from the following description, the appended claims and the accompanying drawings.

BRIEF DESCRIPTION OF THE DRAWINGS

FIGS. 3(a) and 3(b) show are schematic cross sections of the silicon substrate illustrating mis-orientation of the (111) silicon substrate, wherein FIG. 3(a) shows a case without the mis-orientation, and FIG. 3(b) shows a <111> direction of the silicon substrate which is mis-oriented toward $<1\bar{1}0>$ direction thereof;

DETAILED DESCRIPTION OF THE PREFERRED EMBODIMENTS

The basic concept of the present invention exists in that a group II-VI compound semiconductor epitaxial layer having a (111) plane can be grown on a (111) silicon substrate with excellent lattice-matching when a 30° in-plane rotation slip exists in the interface between the epitaxial layer and the underlying silicon substrate. When the epitaxial layer is a CdTe layer, the lattice mismatch is reduced from 19% of the prior art to 3.4%. This is schematically shown in FIGS. 1 and 2.

Figure 1:
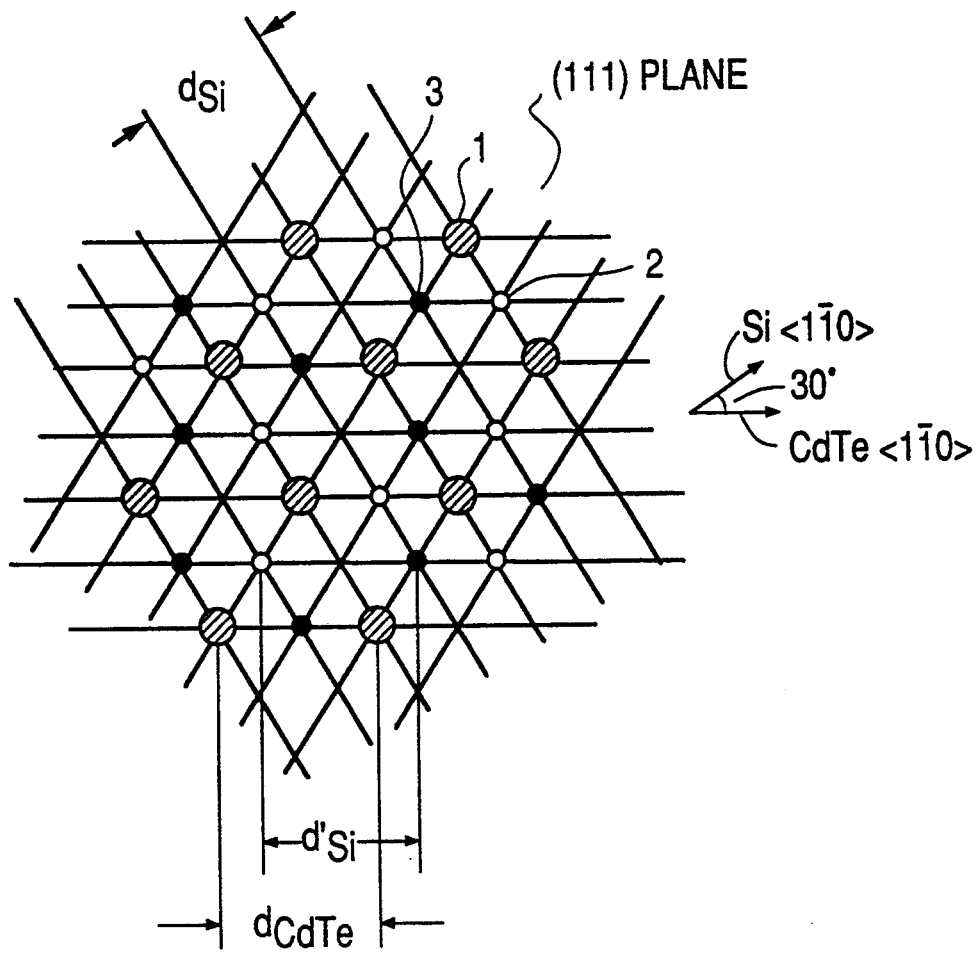
FIG. 1 shows a schematic top view of a lattice structure at the interface between a CdTe epitaxial layer and a silicon substrate, in which a 30° in-plane rotation slip is formed in the interface.

FIG. 1 is a schematic top view of the lattice structure at the interface between the CdTe epitaxial layer and the silicon substrate. The respective (111) planes of the CdTe layer and the silicon substrate are parallel to the sheet of the figures. The $<1\bar{1}0>$ direction of the silicon substrate and the $<1\bar{1}0>$ direction of the CdTe layer lie within the $<111>$ plane (i.e. in the sheet of the figure), and form an angle of 30°. Large hatched circles 1 represent either tellurium or cadmium atoms. In FIG. 1, only a first group of atoms existing in a plane for example, Te atoms are illustrated, and a second group of atoms, (Cd atoms) are not shown in order to avoid complexity because the second group of atoms are located on a separated plane from that of the first group and their positions do not exist on mesh-like lines. Open circles 2 represent upper silicon atoms and shaded circles 3 represent lower silicon atoms.

In the prior art growth wherein the $<1\bar{1}0>$ direction of the CdTe is parallel to the $<1\bar{1}0>$ direction of the silicon, the respective atom spacings of CdTe and silicon, which are designated as $d_{CdTe}$ and $d_{Si}$ respectively in FIG. 1, have a ratio of 1.19. This means a 19% lattice mismatch exists. However, when the CdTe layer is grown with the 30° in-plane rotation slip as shown in FIG. 1, the atom spacing $d_{CdTe}$ is to be compared with atom spacing $d'_{Si}$, resulting in obtaining a ratio of 1.034 and thereby reducing the lattice mismatch to 3.4%.

Figure 2:
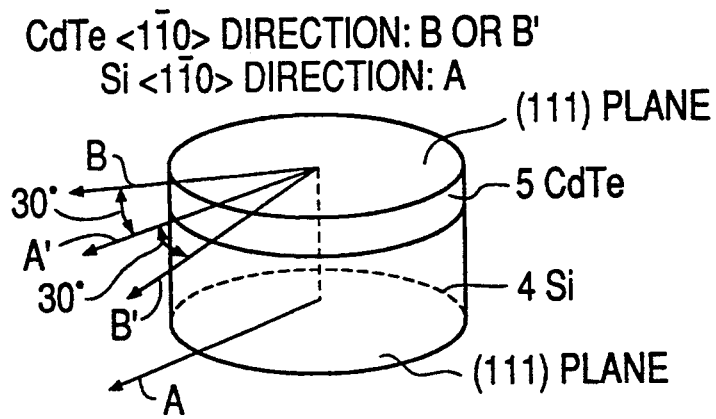
FIG. 2 is a perspective view of a composite crystal structure of the silicon substrate and the epitaxial layer illustrating schematically the above rotation slip.

FIG. 2 illustrates an actually formed product in accordance with the present invention, in which a (111) silicon substrate 4 and a (111) CdTe epitaxial layer 5 formed thereon comprises the composite crystal product, the orientation of the (111) CdTe plane having a 30° in-plane rotation slip with respect to the orientation of the underlying (111) silicon substrate.

The above rotation slip may be explained in the following way. "$<1\bar{1}0>$" direction of the (111) silicon substrate 4 is taken as a reference direction as shown by an arrow A in FIG. 2. In this case, the direction $<1\bar{1}0>$ of the silicon substrate lies in the (111) silicon plane. The $<1\bar{1}0>$ direction of the grown (111) CdTe epitaxial layer 5 as shown by either of the arrows B or B', forms an angle of plus or minus 30° with respect to an arrow A' the arrow A' parallel to the reference direction shown by arrow A. Since the reference direction A' is coincident with either the $<2\bar{1}\bar{1}>$ direction or the $<1\bar{2}1>$ direction of the grown (111) CdTe epitaxial layer 5, the above condition can be described such that either $<2\bar{1}\bar{1}>$ direction or $<1\bar{2}1>$ direction of the grown CdTe is parallel to the $<1\bar{1}0>$ direction of the silicon substrate.

In short, in order to reduce the lattice mismatch and to obtain better crystallinity, the (111) CdTe epitaxial layer 5 as grown on the (111) silicon substrate, is required to have 30° rotation in crystal orientation in either a forward or a backward direction with respect to the silicon substrate.

Experiments showed that a mol ratio of DETe (group VI source gas) to DMCd (group II source gas) during the MOCVD process plays an important role in growing a (111) CdTe epitaxial layer with a 30° in-plane rotation slip on a (111) silicon substrate, and further a mis-orientation of (111) silicon substrate toward $<1\bar{1}0>$ direction is preferable, to suppress twinning of the CdTe epitaxial layer. Details of experiments are described in the following.

[MOCVD growth conditions]

A silicon substrate is first cleaned and annealed in a hydrogen atmosphere (760 Torr) at 1000° C. Next, the temperature is decreased to 400° C., and DMCd and DETe gases are introduced while maintaining the substrate temperature at 400° C., the partial pressure of DMCd being controlled in a range from $1 \times 10^{-2}$ to $1 \times 10^{-3}$ Torr and the partial pressure of DETe being controlled in a range from 1 to $1 \times 10^{-2}$ Torr. Effects of changes in the mol ratio of DETe/DMCd were tested, for values of the mol ratio of 1.5, 5, 15, 20, 30, and 60.

[Mis-orientation of (111) silicon]

Figure 3A:
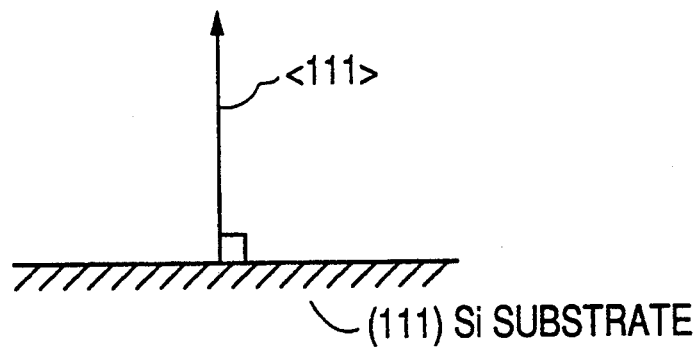
Figure 3B:
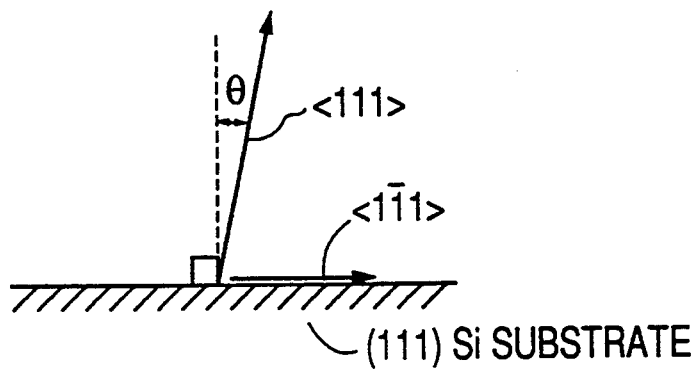

Herein, mis-orientation of a (111) silicon substrate is defined as the substrate surface, the $<111>$ direction of which is inclined by a small angle toward a predetermined direction. This is illustrated in FIGS. 3(a) and 3(b). FIG. 3(a) shows a cross section of a normal (111) substrate in which the direction $<111>$ is vertical to the substrate surface. FIG. 3(b) shows a cross section of a mis-oriented substrate in which the crystal direction $<111>$ of the substrate forms an angle $\theta$ relatively to the normal to a (i.e., vertical line); the substrate surface. If it is assumed that the substrate is inclined toward the $<1\bar{1}0>$ direction (in the figure, the $<1\bar{1}0>$ direction of the substrate lies within the plane of the sheet), the mis-orientation orientation is called the (111) substrate mis-oriented by $\theta°$ toward the $<1\bar{1}0>$ direction, or the (111) substrate misoriented by $\theta°$-off toward (i.e., $\theta°$ from the) $<1\bar{1}0>$ direction.

Several types of (111) silicon substrates were prepared and tested, which included different mis-orientation (inclination) angles and different mis-orientation directions.

[Test methods]

The crystalline structure of the grown epitaxial layer was evaluated by a known method of measuring a full width at half-maximum (FWHM) of the (333) plane X-ray rocking curve.

Figure 4:
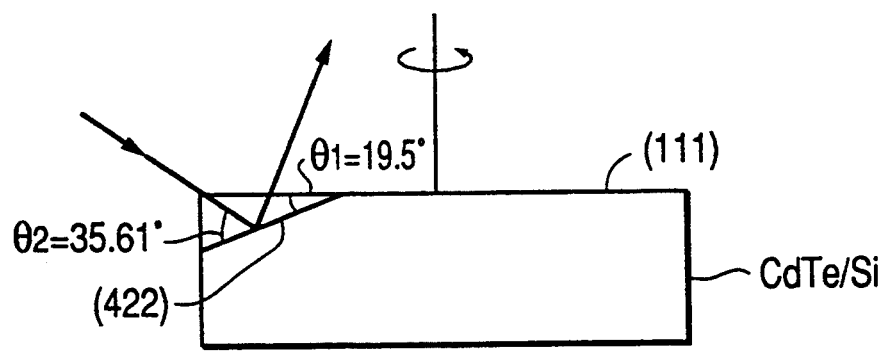
FIG. 4 shows a test method for measuring an amount of the rotation slip of the composite crystal structure.

In order to find whether the grown epitaxial layer has the 30° in-plane rotation slip and whether it exhibits twinning or not the crystal direction of the grown epitaxial layer was tested by measuring the X-ray diffraction intensity. This test method is briefly described using FIG. 4. There exists a (422) plane, in each of the CdTe epitaxial layer and the silicon substrate, which forms an angle of 19.5° with respect to the respective (111) planes of the epitaxial layer and substrate. When the incident X-ray has an incident angle of 35.61°, reflected X-ray has a maximum intensity. The arrangements of X-ray projection and detection are fixed on this condition. The silicon substrate with the CdTe layer is set to be rotatable around an axis of the (111) plane. When the maximum intensity from the (422) plane of the silicon substrate is found, this substrate position is taken as a reference such as angle zero. Next, the substrate is rotated by a specified angle from the reference position, and the reflected X-ray intensity from the (422) plane of the CdTe epitaxial layer is measured. This step is repeated by changing the rotation angle gradually, and an X-ray intensity curve versus rotation angle is plotted.

[Test results]

Figure 5:
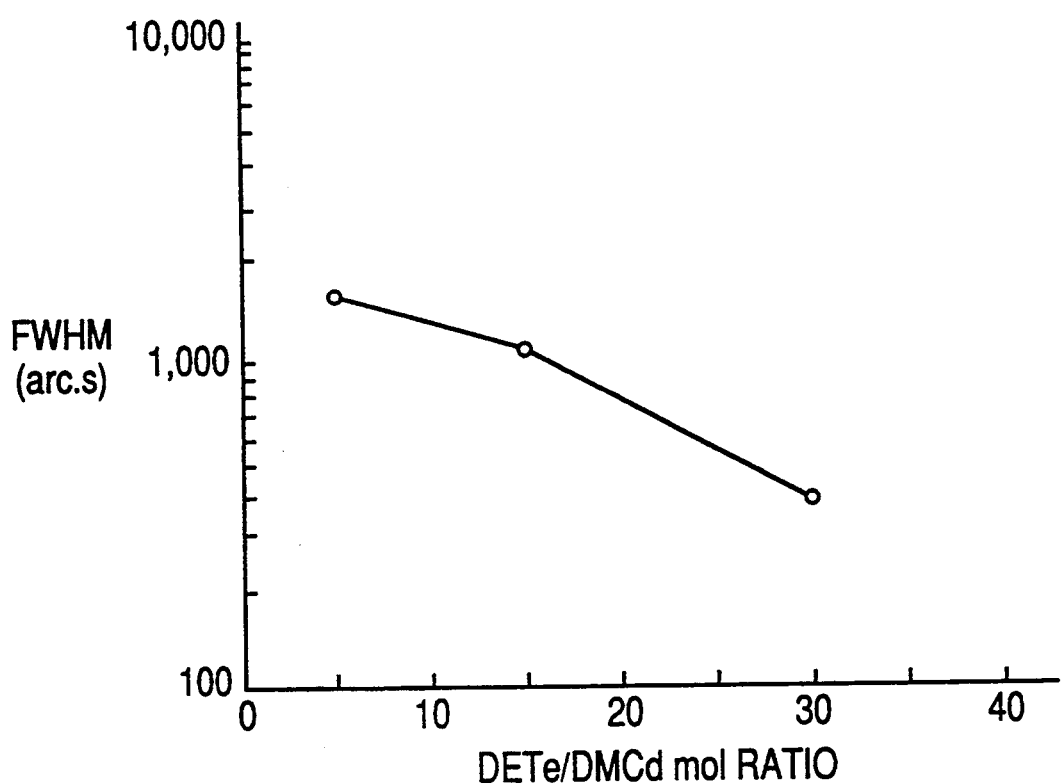
FIG. 5 shows a characteristic of full width at half-maximum of the (333) X-ray rocking curve of the epitaxial layer as a function of changes in the supply ration of the group VI to group II gases.

Crystallinity test results of the grown CdTe epitaxial layer which changes in the mol ratio of DETe/DMCd, are shown, in typical fashion in FIG. 5. The FWHM value decreases (i.e. the crystallinity improves) with an increase of the DETe/DMCd ratio. A mol ratio greater than 15 is preferable.

Figure 6A:
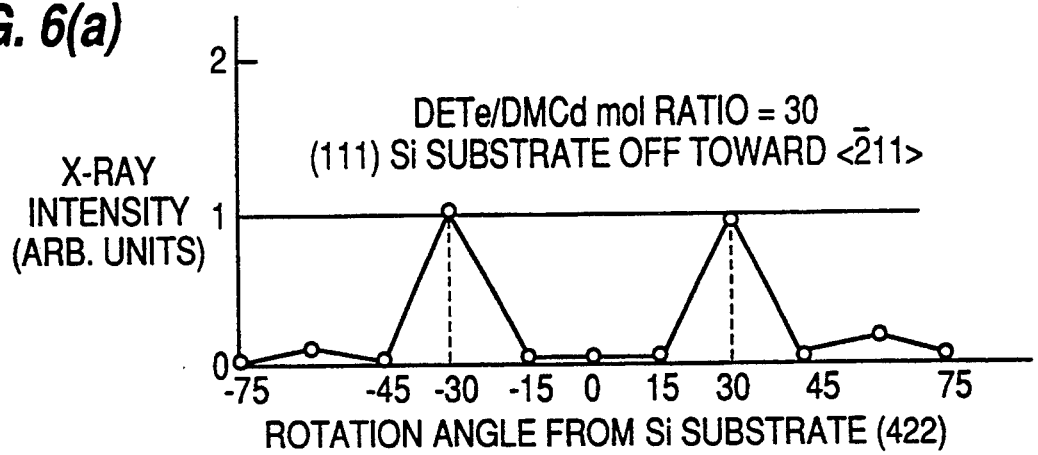
FIGS. 6(a) to 6(c) show (422) X-ray reflection intensity from the CdTe epitaxial layer with respect to the specimen's rotation angle wherein the (422) reflection angle from the silicon substrate is defined as zero.
Figure 6B:
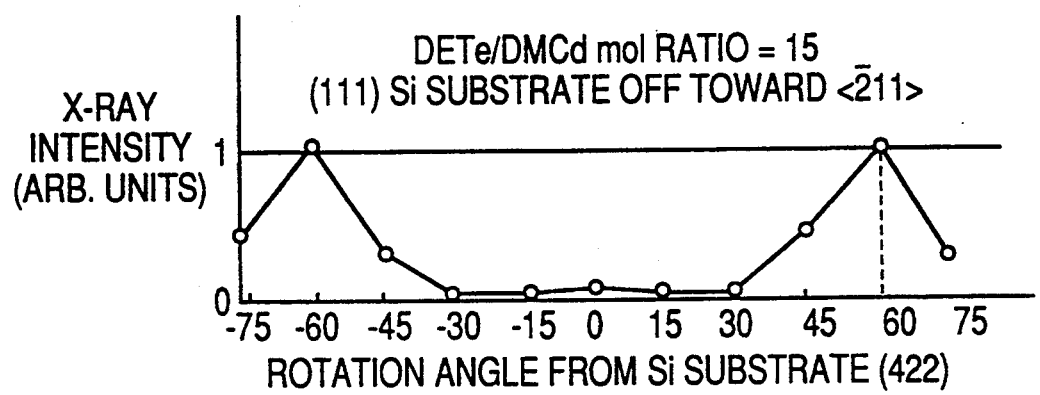
Figure 6C:
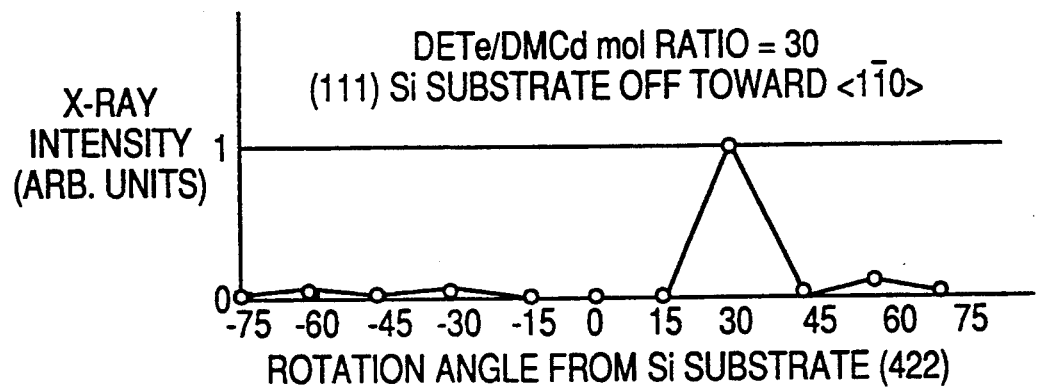

Typical test results for the reflection from the (422) plane are shown in FIGS. 6(a) to 6(c).

Data of FIG. 6(a) are obtained under the condition that the CdTe epitaxial growth is performed while keeping the mol ratio of DETe/DMCd at a constant value of 30, and the (111) silicon is mis-oriented toward the $<\bar{2}11>$ direction. The curve has two peaks at $\pm 30°$ values of the rotation angle. This means that there is a rotation slip of 30° between the CdTe epitaxial layer and the silicon substrate; however, the epitaxial layer exhibits twinning.

Data of FIG. 6(b) are obtained under the condition that the CdTe epitaxial growth is performed while keeping the mol ratio of DETe/DMCd at a constant value of 15, and the (111) silicon is mis-oriented toward $<\bar{2}11>$ direction, as in the case of FIG. 6(a). The curve has two peaks at $\pm 60°$ values of the rotation angle. Because of the symmetrical structure of a zinc-blende type crystal, this means that the grown CdTe epitaxial layer has the same crystal orientation as that of the CdTe layer grown by the prior art method, and it has the same lattice-mismatch with the silicon substrate.

Data of FIG. 6(c) are obtained under the condition that the CdTe epitaxial growth is performed while keeping the mol ratio of DETe/DMCd at a constant value of 30, and the (111) silicon is mis-oriented by 8° toward $<1\bar{1}0>$ direction. The curve has only one peak at a $+30°$ values of the rotation angle. This means that there is a rotation slip of 30° between the CdTe epitaxial layer and the silicon substrate, and the epitaxial layer does not exhibit twinning. Satisfactory results are obtained in this case.

Further test where performed with changes in the mol ratio, the mis-orientation direction of (111) silicon plane and the mis-orientation angle $\theta$. Summarizing all test results, in order to obtain a 30° in-plane rotation slip for (111) CdTe epitaxial on (111) silicon substrate, it is required that the mol ratio of DETe/DMCd be greater than 15 and that the (111) silicon substrate be mis-oriented toward the $<1\bar{1}0>$ direction by an angle of from 1 to 10 degrees.

Figure 7:
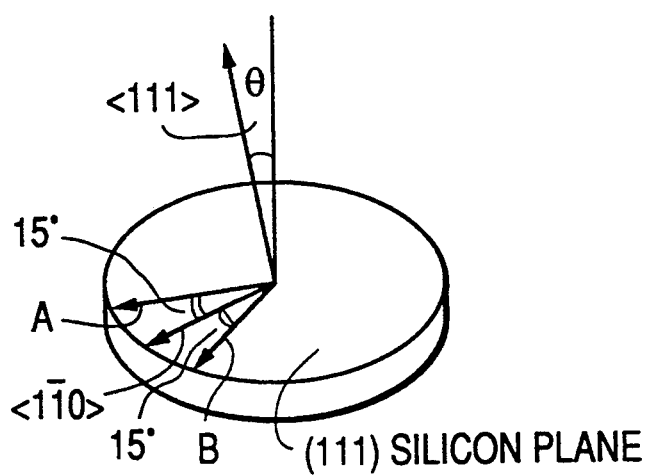
FIG. 7 is a supplementary drawing to FIG. 3(b) for explaining an allowable range of the mis-orientation direction $<1\bar{1}0>$ of the (111) silicon substrate.

The above direction $<1\bar{1}0>$ of mis-orientation may have an allowable angle range of $\pm 15°$ on the (111) plane. This range is schematically shown in FIG. 7. The $<111>$ direction of the silicon substrate may be inclined toward either of arrows A and B, wherein the angle formed between the direction $<1\bar{1}0>$ and either the arrow A or the arrow B being limited to within 15°.

[Additional improvements]

In the above embodiments, a (111) CdTe epitaxial layer is grown on a (111) silicon substrate. When zinc is mixed in the CdTe epitaxial layer, namely, $Cd_{1-x}Zn_xTe$ is grown on the (111) silicon substrate, lattice mismatch is further reduced and, in an ideal case where $x=0.55$, the lattice mismatch is reduced to 0%. This can be performed by adding diethylzinc (DEZn) source gas during the MOCVD growth previously described. A partial pressure of diethylzinc gas is determined at a selected value within a range of from $10^{-2}$ to $10^{-4}$ Torr so as to obtain the mixing ratio x of 0.55.

Further, GaAs which has a crystal structure of a zinc-blende type can be used as a substrate in a similar way instead of using a silicon substrate. Further, a composite structure composed of silicon and GaAs, with the GaAs epitaxially grown on the silicon substrate, may be used as a secondary substrate.

The presently disclosed embodiments are, to be considered in all respects as illustrative and not restrictive, the scope of the invention being indicated by the appended claims, rather than the foregoing description, and all modifications which come within the meaning and range of equivalence of the claims are, therefore, to be embraced therein.

What is claimed is:

1. A method of growing a group II-VI epitaxial layer on a substrate by a MOCVD method, the substrate being of a material selected from the group consisting of silicon, gallium arsenide and gallium arsenide on silicon and having a (111) plane, said method comprising the steps of:
   providing a plurality of metal organic gas sources respectively supplying the elements of said group II-VI epitaxial layer and
   flowing a carrier gas and said plurality of source gases over, and heating, said substrate in accordance with the MOCVD method, wherein the relative amounts of source gases supplied on the substrate has a mol ratio as defined by (group VI gas supply volume)/(group II gas supply volume) which is greater than 15, thereby growing epitaxial layer on said substrate with a 30° inplane rotational slip between the respective crystal orientations.

2. A method of growing a group II-VI epitaxial layer on a substrate as recited in claim 1, wherein said (111) plane of the substrate is mis-oriented toward a $<1\bar{1}0>$ direction of said substrate.

3. A method of growing a group II-VI epitaxial layer on a substrate as recited in claim 2, wherein said misorientation angle is within a range of from 1 degree to 10 degrees.

4. A method of growing a group II-VI epitaxial layer on a substrate as recited in claim 2, wherein said (111) plane is misoriented toward the $<1\bar{1}0>$ direction within an allowable range of plus and minus 15 degrees.

5. A method of growing a group II-VI epitaxial layer on a substrate as recited in claim 1, wherein said plurality of metal organic gas sources comprises a cadmium source gas and a tellurium source gas and the epitaxial layer thereby comprises a cadmium telluride (CdTe) layer.

6. A method of growing a group II-VI epitaxial layer on a substrate as recited in claim 1, wherein said plurality of metal organic gas sources comprises a cadmium source gas, a zinc source gas, and a tellurium source gas and the epitaxial layer thereby comprises a cadmium zinc telluride (CdZnTe) layer being grown on the substrate.

7. A method of growing a group II-VI epitaxial layer on a substrate as recited in claim 6, wherein said cadmium zinc telluride epitaxial layer has a composition of $Cd_{0.45}Zn_{0.55}Te$.

* * * * *

UNITED STATES PATENT AND TRADEMARK OFFICE
CERTIFICATE OF CORRECTION

PATENT NO. : 5,394,826
DATED : March 7, 1995
INVENTOR(S) : EBE et al.

It is certified that error appears in the above-indentified patent and that said Letters Patent is hereby corrected as shown below:

TITLE PAGE: [73] Assignee: change "Kawasaku" to --Kawasaki--;
[56] References Cited - OTHER PUBLICATIONS: Ebe et al. reference, last line, change "Lusanne" to --Lausanne--.

Col. 1, line 61, change "Apple." to --Appl.--.

Col. 2, line 17, after "It is" insert --a--;
line 48, after "layer" insert --,--;
line 50, delete "show";
line 60, change "ration" to --ratio--.

Col. 3, line 55, change "A' the arrow A'" to --A', the arrow A' being--;
line 60, after "either" insert --the--; and after "or" insert --the--.

Col. 4, line 33, delete "to a"; and change ";" to --of--;
line 53, after "not" insert --,--.

Col. 5, line 9, change "which" to --with--;
line 10, after "fashion" insert --,--;
line 11, after "(i.e." insert --,--;
line 46, change "test where performed" to --tests were performed,--.

UNITED STATES PATENT AND TRADEMARK OFFICE
CERTIFICATE OF CORRECTION

PATENT NO. : 5,394,826
DATED : March 7, 1995
INVENTOR(S) : EBE et al.

It is certified that error appears in the above-indentified patent and that said Letters Patent is hereby corrected as shown below:

Col. 6, line 13, change "are," to --are--;
line 34, after "ratio" insert --,--;
line 35, after "volume)" (second occurrence) insert --,--.

Signed and Sealed this

Seventeenth Day of October, 1995

Attest:

BRUCE LEHMAN

Attesting Officer          Commissioner of Patents and Trademarks